(12) United States Patent
Nomiya

(10) Patent No.: US 10,607,775 B2
(45) Date of Patent: Mar. 31, 2020

(54) ELECTRONIC COMPONENT DEVICE, HIGH-FREQUENCY FRONT END CIRCUIT, AND COMMUNICATION DEVICE

(71) Applicant: Murata Manufacturing Co., Ltd., Nagaokakyo-shi, Kyoto-fu (JP)

(72) Inventor: Masato Nomiya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/452,590

(22) Filed: Jun. 26, 2019

(65) Prior Publication Data
US 2019/0318871 A1  Oct. 17, 2019

Related U.S. Application Data

(63) Continuation of application No. PCT/JP2017/046431, filed on Dec. 25, 2017.

(30) Foreign Application Priority Data

Dec. 27, 2016  (JP) .................. 2016-254500

(51) Int. Cl.
*H01G 4/012* (2006.01)
*H01G 4/40* (2006.01)
(Continued)

(52) U.S. Cl.
CPC ......... *H01G 4/012* (2013.01); *H01F 17/0013* (2013.01); *H01F 27/008* (2013.01);
(Continued)

(58) Field of Classification Search
None
See application file for complete search history.

(56) References Cited

U.S. PATENT DOCUMENTS

| 6,724,638 B1 | 4/2004 | Inagaki et al. |
| 2003/0030994 A1* | 2/2003 | Takaya ............... H01F 5/06 361/728 |

(Continued)

FOREIGN PATENT DOCUMENTS

| CN | 101667484 A | 3/2010 |
| JP | 2002-100874 A | 4/2002 |

(Continued)

OTHER PUBLICATIONS

Official Communication issued in International Patent Application No. PCT/JP2017/046431, dated Mar. 20, 2018.

*Primary Examiner* — Mohammed Rachedine
(74) *Attorney, Agent, or Firm* — Keating & Bennett, LLP

(57) ABSTRACT

An electronic component device includes an electronic component, a resin structure including the electronic component such that one main surface thereof is exposed, a through-electrode, and first and second wiring layers, in which the electronic component includes an element body, an inner electrode in the element body and connected to the first and second wiring layers, and an adjustment electrode provided in an adjustment region in the element body, the first wiring layer is continuously provided on the inner electrode, the adjustment region, and the resin structure, and a thermal expansion coefficient of the resin structure, a thermal expansion coefficient of the adjustment region, and a thermal expansion coefficient of the inner electrode satisfy an expression of the thermal expansion coefficient of the resin structure≤the thermal expansion coefficient of the adjustment region≤the thermal expansion coefficient of the inner electrode.

20 Claims, 5 Drawing Sheets

(51) Int. Cl.
 *H01G 4/30*  (2006.01)
 *H01G 4/258*  (2006.01)
 *H01G 4/224*  (2006.01)
 *H04B 1/40*  (2015.01)
 *H01F 27/40*  (2006.01)
 *H01F 27/00*  (2006.01)
 *H05K 3/46*  (2006.01)
 *H01L 25/18*  (2006.01)
 *H01L 25/11*  (2006.01)
 *H01L 25/10*  (2006.01)
 *H01L 23/12*  (2006.01)
 *H03H 7/01*  (2006.01)
 *H01F 17/00*  (2006.01)

(52) U.S. Cl.
 CPC .............. *H01F 27/40* (2013.01); *H01G 4/224* (2013.01); *H01G 4/258* (2013.01); *H01G 4/30* (2013.01); *H01G 4/40* (2013.01); *H04B 1/40* (2013.01); *H01F 2017/004* (2013.01)

(56) References Cited

U.S. PATENT DOCUMENTS

| | | | |
|---|---|---|---|
| 2004/0184219 A1 | 9/2004 | Otsuka et al. | |
| 2006/0238948 A1* | 10/2006 | Tominaga | H01G 4/232 361/118 |
| 2007/0076348 A1* | 4/2007 | Shioga | H01G 4/232 361/307 |
| 2010/0052838 A1 | 3/2010 | Matsuta et al. | |

FOREIGN PATENT DOCUMENTS

| | | |
|---|---|---|
| JP | 2004-304159 A | 10/2004 |
| JP | 2005-310954 A | 11/2005 |

* cited by examiner

ELECTRONIC COMPONENT DEVICE, HIGH-FREQUENCY FRONT END CIRCUIT, AND COMMUNICATION DEVICE

CROSS REFERENCE TO RELATED APPLICATIONS

This application claims the benefit of priority to Japanese Patent Application No. 2016-254500 filed on Dec. 27, 2016 and is a Continuation Application of PCT Application No. PCT/JP2017/046431 filed on Dec. 25, 2017. The entire contents of each application are hereby incorporated herein by reference.

BACKGROUND OF THE INVENTION

1. Field of the Invention

The present invention relates to an electronic component device, a high-frequency front end circuit, a communication device, and the like.

2. Description of the Related Art

In recent years, electronic component devices, such as a semiconductor package or the like, in which an electronic component includes a multilayer body formed from a ceramic material or the like as an element body and the element body in which the electronic component is formed is embedded in a resin structure have been developed (see, for example, Japanese Unexamined Patent Application Publication No. 2005-310954).

In a semiconductor package disclosed in Japanese Unexamined Patent Application Publication No. 2005-310954, a semiconductor package in which an electronic component is incorporated into an insulating resin layer is disclosed. In the semiconductor package, a through-electrode for connecting the electronic component to a terminal outside the semiconductor package is provided at a position of the insulating resin layer at which the electronic component is not arranged. A wiring layer is provided from the electronic component to the through-electrode on a main surface of the semiconductor package. The wiring layer is routed on the insulating resin layer from the electronic component to the through-electrode.

However, in the electronic component device, the element body portion in a region in which the electronic component is formed is, for example, made of a ceramic material, and a region surrounding the element body portion is a resin structure made of, for example, a resin. That is, materials having different thermal expansion coefficients are used for the element body portion and the region surrounding the element body portion. For example, the resin structure has a larger thermal expansion coefficient and more easily expands by heat than the element body portion. Accordingly, when the element body portion and the resin structure are heated due to a change in environment temperature, there is a problem that the difference in the thermal expansion coefficient between the element body portion and the resin structure causes the resin structure to expand more easily than the element body portion, and the wiring is cut at a boundary between the resin structure and the element body portion.

SUMMARY OF THE INVENTION

Preferred embodiments of the present invention provide electronic component devices, high-frequency front end circuits, and communication devices that are each capable of reducing or preventing a wiring from being cut at a boundary between a resin structure and an element body portion of an electronic component.

An electronic component device according to a preferred embodiment of the present invention includes an electronic component; a resin structure incorporating the electronic component in a state in which one main surface of the electronic component is exposed; and a wiring layer provided on a surface of the resin structure, in which the electronic component includes an element body, an inner electrode incorporated in the element body and connected to the wiring layer, and an adjustment electrode provided at least in an adjustment region between the inner electrode and a side surface of the resin structure closest to the inner electrode in the element body, the wiring layer is continuously provided on the inner electrode, the adjustment region, and the resin structure, and a thermal expansion coefficient of the resin structure, a thermal expansion coefficient of the adjustment region, and a thermal expansion coefficient of the inner electrode satisfy a relationship of the thermal expansion coefficient of the resin structure—the thermal expansion coefficient of the adjustment region≤the thermal expansion coefficient of the inner electrode.

With this configuration, by providing the adjustment electrode in the element body portion disposed between the resin structure and the inner electrode, the region between the resin structure and the inner electrode is provided as the adjustment region, and the thermal expansion coefficient of the resin structure, the thermal expansion coefficient of the adjustment region, and the thermal expansion coefficient of the inner electrode are adjusted to satisfy the relationship of the thermal expansion coefficient of the resin structure≤the thermal expansion coefficient of the adjustment region≤the thermal expansion coefficient of the inner electrode. This makes it possible to reduce each of the differences in the thermal expansion coefficients between the resin structure and the adjustment region, and between the adjustment region and the inner electrode. Therefore, since a change in the thermal expansion coefficient is reduced in the region between the resin structure and the inner electrode, it is possible to reduce or prevent a wiring from being cut at a boundary between the resin structure and the element body.

Furthermore, the thermal expansion coefficient of the adjustment electrode may be larger than the thermal expansion coefficient of the element body.

With this configuration, the thermal expansion coefficient in the adjustment region is larger than the thermal expansion coefficient of the element body before the adjustment electrode is provided. Therefore, it is possible to reduce the differences in the thermal expansion coefficients between the resin structure and the element body, and between the element body and the inner electrode. Accordingly, it is possible to reduce or prevent the wiring from being cut at the boundary between the resin structure and the element body.

Furthermore, the adjustment electrode may be in contact with the resin structure.

With this configuration, in the adjustment region, the thermal expansion coefficient of the adjustment region on a side near the resin structure is increased. This makes it possible to adjust the thermal expansion coefficient of the adjustment region to a value between the thermal expansion coefficient of the resin structure and the thermal expansion coefficient of the element body, and reduce the difference in the thermal expansion coefficient at the boundary between the resin structure and the element body. Thus, it is possible to reduce or prevent the wiring from being cut at the boundary between the resin structure and the element body.

Furthermore, the adjustment electrode may be in contact with the inner electrode.

With this configuration, in the adjustment region, the thermal expansion coefficient of the adjustment region on a side near the inner electrode is increased. This makes it possible to adjust the thermal expansion coefficient of the adjustment region to the value between the thermal expansion coefficient of the resin structure and the thermal expansion coefficient of the element body and reduce the difference in the thermal expansion coefficient at the boundary between the resin structure and the element body. Thus, it is possible to reduce or prevent the wiring from being cut at the boundary between the resin structure and the element body.

Furthermore, a plurality of the adjustment electrodes may be arranged along the inner electrode in a depth direction of the element body.

With this configuration, the thermal expansion coefficient of the element body in the depth direction is evenly increased. This makes it possible to adjust the thermal expansion coefficient of the adjustment region to the value between the thermal expansion coefficient of the resin structure and the thermal expansion coefficient of the element body over the entire or substantially the entire adjustment region. Accordingly, it is possible to reduce or prevent the wiring from being cut at the boundary between the resin structure and the element body.

Furthermore, the plurality of adjustment electrodes may have an identical or substantially identical thickness in the depth direction of the element body.

With this configuration, the thermal expansion coefficient of the element body in the depth direction is substantially uniformly adjusted. This makes it possible to adjust the thermal expansion coefficient of the adjustment region to the value between the thermal expansion coefficient of the resin structure and the thermal expansion coefficient of the element body over the entire adjustment region. Accordingly, it is possible to reduce or prevent the wiring from being cut at the boundary between the resin structure and the element body.

Furthermore, the plurality of adjustment electrodes may be arranged periodically along the inner electrode in the depth direction of the element body.

With this configuration, the thermal expansion coefficient in the adjustment region is uniformly adjusted along the inner electrode. This makes it possible to adjust the thermal expansion coefficient of the adjustment region to the value between the thermal expansion coefficient of the resin structure and the thermal expansion coefficient of the element body along the inner electrode. Accordingly, it is possible to reduce or prevent the wiring from being cut at the boundary between the resin structure and the element body.

Furthermore, the adjustment electrode may be made of a metal.

With this configuration, by using the metal as the adjustment electrode, the thermal expansion coefficient of the adjustment region is increased. This makes it possible to adjust the thermal expansion coefficient of the adjustment region to the value between the thermal expansion coefficient of the resin structure and the thermal expansion coefficient of the element body. Thus, it is possible to reduce or prevent the wiring from being cut at the boundary between the resin structure and the element body.

Furthermore, the adjustment electrode may be made of the same material as a material of the inner electrode.

With this configuration, the thermal expansion coefficient in the adjustment region is able to be adjusted to the value between the thermal expansion coefficient of the resin structure and the thermal expansion coefficient of the element body, and is able to be brought close to the thermal expansion coefficient of the wiring layer. This makes it possible to reduce or prevent the wiring from being cut at the boundary between the resin structure and the element body.

Furthermore, the adjustment electrode may protrude from the inner electrode.

With this configuration, the thermal expansion coefficient is gradually increased from the inner electrode. Accordingly, it is possible to adjust the thermal expansion coefficient of the adjustment region to the value between the thermal expansion coefficient of the resin structure and the thermal expansion coefficient of the element body and reduce the difference in the thermal expansion coefficient at the boundary between the resin structure and the element body. Thus, it is possible to reduce or prevent the wiring from being cut at the boundary between the resin structure and the element body.

Furthermore, the inner electrode may include a first inner electrode and a second inner electrode connected to the first inner electrode, and at least one of the first inner electrode and the second inner electrode may be an inductor.

With this configuration, the thermal expansion coefficient of the electronic component device including the inductor as an electronic component is able to be adjusted. This makes it possible to reduce the difference in the thermal expansion coefficient at the boundary between the resin structure and the element body in which the inductor is provided. Thus, it is possible to reduce or prevent the wiring from being cut at the boundary between the resin structure and the element body.

Furthermore, the inner electrode may include a first inner electrode and a second inner electrode, the wiring layer may include a first wiring layer and a second wiring layer, the first inner electrode may be connected to the first wiring layer and be in contact with the adjustment region, the second inner electrode may be connected to the second wiring layer and be in contact with the adjustment region, and the electronic component may be a capacitor including a first planar electrode connected to the first inner electrode and a second planar electrode connected to the second inner electrode.

With this configuration, the thermal expansion coefficient of the electronic component device including the capacitor as an electronic component is able to be adjusted. This makes it possible to reduce the difference in the thermal expansion coefficient at the boundary between the resin structure and the element body in which the capacitor is provided. Thus, it is possible to reduce or prevent the wiring from being cut at the boundary between the resin structure and the element body.

Furthermore, the element body may have a rectangular or substantially rectangular shape when viewed in a plan view from a side of a surface where the wiring layer is provided, and the adjustment electrode may be provided along a portion of each of two sides configuring at least one corner portion of the rectangular shape of the element body.

With this configuration, the adjustment region is able to be provided in an L-shape in at least one corner portion of the rectangular or substantially rectangular shape of the element body. This makes it possible to provide a large number of the adjustment electrodes in the adjustment region. Thus, it is possible to increase contact areas between the adjustment electrode and the resin structure, and between the adjustment electrode and an element body 21. Accordingly, it is possible to reduce or prevent the wiring from being cut at the boundary between the resin structure and the element body.

Furthermore, a mounting substrate, the electronic component device having the above-described characteristics mounted on the mounting substrate, and a mounted component further mounted on the electronic component device may be included.

This makes it possible to provide the electronic component device, which includes the electronic component device having the above-described characteristics, capable of reducing or preventing the wiring from being cut at the boundary between the resin structure and the element body.

Furthermore, the resin structure may include a through-electrode penetrating through both surfaces of the resin structure, and the through-electrode may be connected to the mounting substrate and the wiring layer.

With this configuration, the mounted component and the electronic component device are electrically connected to the mounting substrate. Accordingly, it is possible to mount the electronic component device capable of reducing or preventing the wiring from being cut at the boundary between the resin structure and the element body on the mounting substrate.

Furthermore, a plurality of the electronic component devices may be included, and the plurality of electronic component devices may be stacked between the mounting substrate and the mounted component.

This makes it possible to provide the electronic component device, in which the plurality of electronic component devices are stacked, and capable of reducing or preventing the wiring from being cut at the boundary between the resin structure and the element body.

A high-frequency front end circuit according to a preferred embodiment of the present invention includes an electronic component device having the above-described characteristics as a high-frequency element.

This makes it possible to provide the high-frequency front end circuit including the electronic component device having the above-described characteristics as the high-frequency element, and capable of reducing or preventing the wiring from being cut at the boundary between the resin structure and the element body.

A communication device according to a preferred embodiment of the present invention includes an RF signal processing circuit to process a high-frequency signal transmitted and received through an antenna element; and a high-frequency front end circuit including the above-described characteristics to transmit the high-frequency signal between the antenna element and the RF signal processing circuit.

This makes it possible to provide the communication device including the high-frequency front end circuit having the above-described characteristics, and capable of reducing or preventing the wiring from being cut at the boundary between the resin structure and the element body.

According to preferred embodiments of the present invention, it is possible to provide electronic component devices, high-frequency front end circuits, and communication devices each capable of reducing or preventing a wiring from being cut at a boundary between a resin structure and an element body portion of an electronic component.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
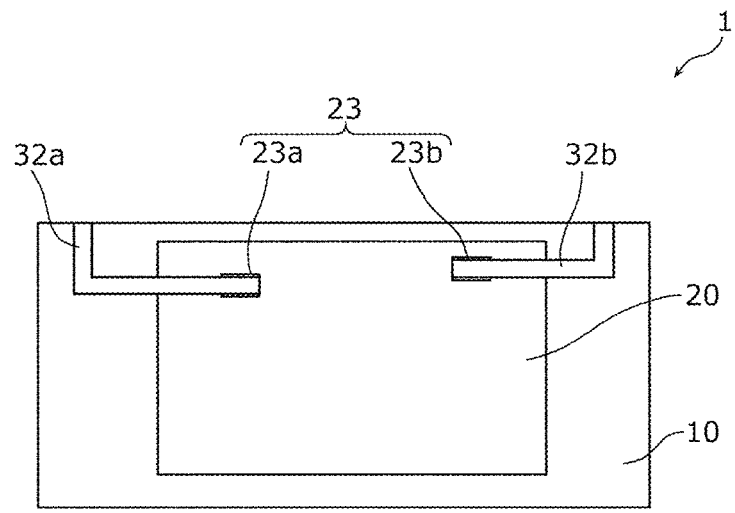
FIG. 1 is a plan view illustrating an example of an external appearance of an electronic component device according to a first preferred embodiment of the present invention.

Hereinafter, preferred embodiments of the present invention will be described in detail with reference to the drawings. All preferred embodiments described below indicate comprehensive or specific examples. Numerical values, shapes, materials, elements, arrangement and connection structure of the elements, and other aspects, which will be described in the following preferred embodiments, are examples, and are not intended to limit the scope of the present invention. Elements which are not described in independent claims among the elements in the following preferred embodiments are described as arbitrary or optional elements. In addition, sizes or size ratios of the elements illustrated in the drawings are not necessarily restrictive.

In addition, in transparent plan views and transparent cross-sectional views in the drawings illustrated below, for the sake of simplicity, the elements which are present strictly in different cross sections are illustrated in the same drawing and described in some cases.

First Preferred Embodiment

An electronic component device 1 according to a first preferred embodiment of the present invention is provided in, for example, a communication device or the like used to transmit and receive a high-frequency signal.

Figure 2A:
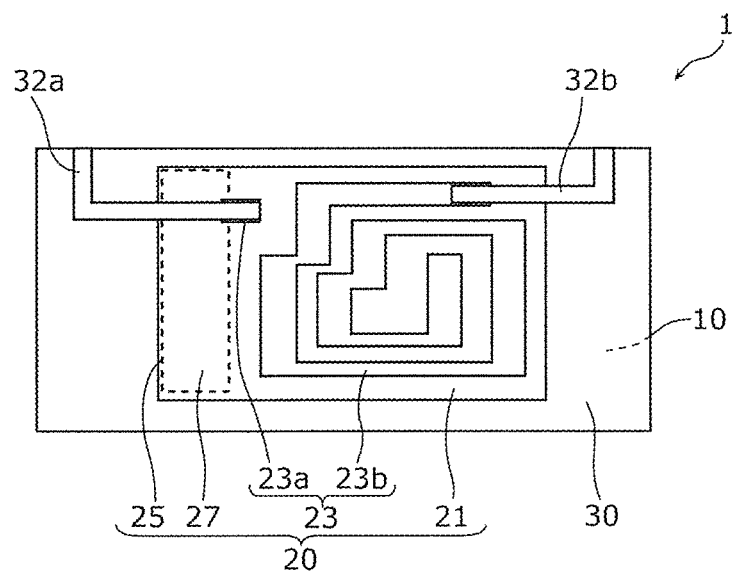
FIG. 2A is a transparent plan view illustrating an internal configuration of the electronic component device according to the first preferred embodiment of the present invention.

First, a configuration of the electronic component device 1 according to the present preferred embodiment will be described. FIG. 1 is a plan view illustrating an example of an external appearance of the electronic component device 1 according to the present preferred embodiment when viewed in a plan view. FIG. 2A is a transparent plan view illustrating an internal configuration of the electronic component device 1 according to the present preferred embodiment. FIG. 2B to FIG. 3B are transparent cross-sectional views each illustrating the internal configuration of the electronic component device 1 according to the present preferred embodiment.

As illustrated in FIG. 1, the electronic component device 1 includes a resin structure 10 and an electronic component 20 disposed in the resin structure 10. The electronic component 20 is disposed in the resin structure 10 in a state in which one main surface is exposed. Furthermore, a first wiring layer 32a and a second wiring layer 32b are provided on surfaces of the electronic component 20 and the resin structure 10. The first wiring layer 32a and the second wiring layer 32b are connected to an inner electrode 23 of the electronic component 20, and are continuously provided on the inner electrode 23, an adjustment region 25, which will be described later, and the resin structure 10.

The resin structure 10 is preferably made of, for example, a resin material such as a synthetic resin or the like. As the synthetic resin, for example, an epoxy resin, an acrylic resin, or the like may preferably be used. Preferably, a material obtained, for example, by adding an inorganic filler such as silica, alumina, or the like, to the synthetic resin, such as the epoxy resin, may be used. By adding such an inorganic filler, a sealing property of the electronic component 20, which will be described later, by the resin structure 10 is able to be improved. Additionally, a rigidity of the resin structure 10 is able to be improved. Furthermore, since contraction at the time of curing the resin structure 10 is reduced, sealing accuracy is able to be improved. A method of adjusting a coefficient of linear expansion of the resin structure 10 is known, but it is difficult to adjust the coefficients of linear expansion between the resin structure 10 and an element body 21 of the electronic component 20, and between the element body 21 and the inner electrode 23 with the known method. In contrast, in the electronic component device 1, the coefficients of linear expansion are adjusted between the resin structure 10 and the element body 21 of the electronic component 20, and between the element body 21 and the inner electrode 23.

Figure 2B:
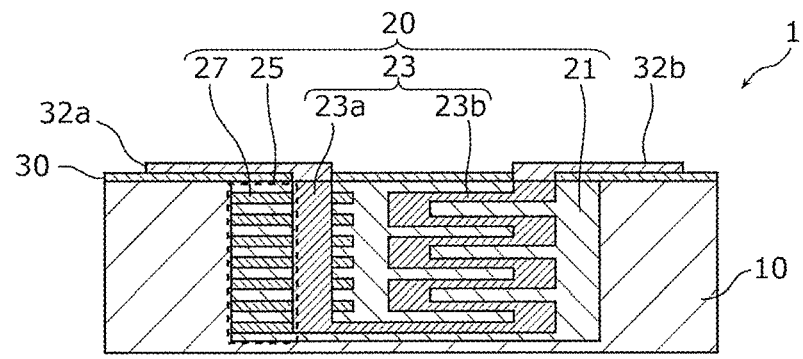
FIG. 2B is a transparent cross-sectional view illustrating the internal configuration of the electronic component device according to the first preferred embodiment of the present invention.
Figure 3A:
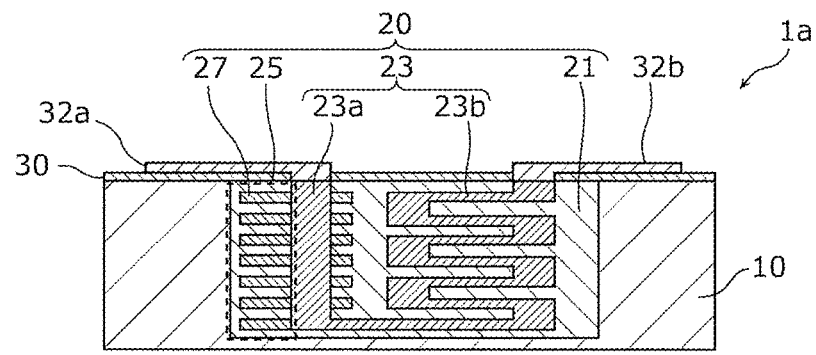
FIG. 3A is a transparent cross-sectional view illustrating an example of the internal configuration of the electronic component device according to the first preferred embodiment of the present invention.
Figure 3B:
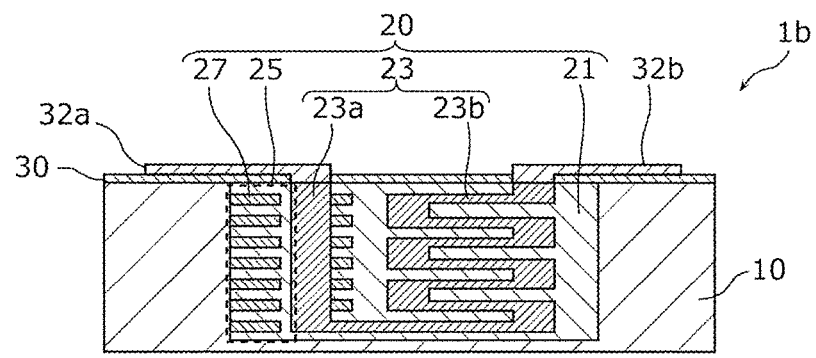
FIG. 3B is a transparent cross-sectional view illustrating another example of the internal configuration of the electronic component device according to the first preferred embodiment of the present invention.

As illustrated in FIGS. 2A and 2B, the electronic component 20 includes the inner electrode 23 in the element body 21. More specifically, the element body 21 is preferably a multilayer body in which a plurality of layers made of a ceramic-containing material or the like are laminated, and the inner electrode 23 is provided inside the element body 21.

The element body 21 is preferably made of, for example, alumina, ceramic powder, glass, a resin, or a mixture thereof.

The inner electrode 23 includes a first inner electrode 23a and a second inner electrode 23b. As illustrated in FIG. 2B, the first inner electrode 23a passes through the respective layers of the element body 21 and has a pillar shape in a thickness direction of the element body 21.

The second inner electrode 23b is a functional element disposed at a position different from that of the first inner electrode 23a. For example, as illustrated in FIG. 2B, the second inner electrode 23b is an inductor in which a coil pattern is defined by electrodes having a planar shape on the respective layers of the element body 21 and pillar-shaped electrodes connecting the electrodes having the planar shape on the respective layers. In the electronic component device 1 illustrated in FIG. 2B, in the element body 21, the first inner electrode 23a and the second inner electrode 23b are connected to each other in the vicinity of one main surface on an opposite side from the other main surface on which the component is exposed from the resin structure 10. The second inner electrode 23b is not limited to the inductor, may be another functional element, such as a capacitor or the like, or may be an electrode passing through the respective layers of the element body 21 and having a pillar shape in the thickness direction of the element body 21, in the same or similar manner as the first inner electrode 23a.

In the electronic component 20, the element body 21 is preferably made of, for example, alumina, ceramic powder, glass, a resin, or a mixture thereof. The first inner electrode 23a and the second inner electrode 23b are preferably made of, for example, Cu. The first inner electrode 23a and the second inner electrode 23b may be made of another material other than Cu. For example, the first inner electrode 23a and the second inner electrode 23b may be made of a single metal having good conductivity such as Ag, W, Au, Ni, or the like, or an alloy containing the metal having good conductivity as its main component, or such as a mixture of the above-described main component and glass, a resin, ceramics, or the like. Furthermore, the first inner electrode 23a and the second inner electrode 23b are not limited to being made of the same material, and may be made of different materials.

In the electronic component device 1 described above, the first inner electrode 23a is described as the electrode having the pillar shape in the thickness direction of the element body 21 as an example, but the first inner electrode 23a may be defined by electrodes having a planar shape on the respective layers of the element body 21 and pillar-shaped electrodes to connect the electrodes having a planar shape on the respective layer. The first inner electrode 23a may be an inductor in the same or similar manner as the second inner electrode 23b described above, or may be another functional element, such as a capacitor or the like. Furthermore, a semiconductor element made of Si or the like may be provided as the second inner electrode 23b.

Furthermore, the adjustment region 25 is provided between the first inner electrode 23a and a side surface of the resin structure 10 closest to the first inner electrode 23a. The adjustment region 25 alleviates the influence of differences in thermal expansion coefficients between the first inner electrode 23a and the element body 21, and between the element body 21 and the resin structure 10, on the first wiring layer 32a. The adjustment region 25 includes the element body 21 of the electronic component 20 and an adjustment electrode 27 provided in the element body 21. A relationship among the thermal expansion coefficients of the resin structure 10, the first inner electrode 23a, the element body 21, the adjustment electrode 27, and the adjustment region 25 will be described later.

The adjustment electrode 27 has a planar shape and extends from the first inner electrode 23a to the side surface of the resin structure 10 closest to the first inner electrode 23a. A plurality of the adjustment electrodes 27 are provided along the first inner electrode 23a in a depth direction of the element body 21. The plurality of adjustment electrodes 27 have the same or substantially the same shape and the same or substantially the same thickness in the depth direction of the element body 21. The plurality of adjustment electrodes 27 protrude from the first inner electrode 23a in a comb-tooth shape at a constant interval (for example, an interval A). The number of adjustment electrodes 27 is not limited to two or more, and may be one. In addition, the adjustment electrode 27 may not have the planar shape, and may have another shape. In addition, when the plurality of adjustment electrodes 27 are provided, the shapes of the adjustment electrodes may be different from one another, or the shapes of the respective adjustment electrodes 27 may be entirely different from one another. Additionally, the adjustment electrodes 27 may be periodically arranged (for example, alternately repeating the interval A and an interval B, or the like) in the depth direction of the element body 21.

The adjustment electrode 27 is preferably made of, for example, Cu. The adjustment electrode 27 is not limited to being made of Cu, and may be made of another metal material such as Ag, Ni, W or the like. The adjustment electrode 27 may be made of the same material as that of the inner electrode 23 of the electronic component 20, or may be made of the same material as that of the first wiring layer 32a and the second wiring layer 32b to be described later.

Further, the first wiring layer 32a connected to the first inner electrode 23a and the second wiring layer 32b connected to the second inner electrode 23b of the electronic component 20, are disposed above the electronic component 20 and the resin structure 10. An insulating layer 30 is provided between the first wiring layer 32a and the resin structure 10 and between the first wiring layer 32a and the element body 21 of the electronic component 20. In the same or similar manner, the insulating layer 30 is provided between the second wiring layer 32b and the resin structure 10 and between the second wiring layer 32b and the element body 21 of the electronic component 20. The insulating layer 30 is preferably made of, for example, an epoxy resin, an acrylic resin, polyimide, a PBO (para-phenylene benzobisoxazole), a BCB (benzocyclobutene), or the like.

However, in a case where insulating characteristics of the resin structure and the element body are able to be sufficiently secured, the insulating layer 30 may be partially or entirely removed.

Here, a relationship among the thermal expansion coefficients of the resin structure 10, the inner electrode 23, the element body 21, the adjustment electrode 27, and the adjustment region 25 will be described. Note that in the following description, the thermal expansion coefficient of the inner electrode 23 is assumed to be an average thermal expansion coefficient of the first inner electrode 23a and the second inner electrode 23b as a whole.

Since the element body 21 of the electronic component 20 provided in the resin structure 10 is made of, for example, a ceramic-containing material, it is preferable that the thermal expansion coefficient of the element body 21 is smaller than those of both of the resin structure 10 and the inner electrode 23. In this case, in the electronic component device 1, since the element body 21 having the thermal expansion coefficient smaller than those of the resin structure 10 and the inner electrode 23 is disposed between the resin structure 10 and the inner electrode 23, the first wiring layer 32a provided on the element body 21 is likely to be disconnected at a boundary between the element body 21 and the resin structure 10.

Therefore, a region in which the element body 21 is disposed between the resin structure 10 and the first inner electrode 23a is defined as the adjustment region 25, and the adjustment electrode 27 is provided in the adjustment region 25. The thermal expansion coefficient of the adjustment electrode 27 is larger than that of the element body 21. Accordingly, the thermal expansion coefficient in the adjustment region 25 is larger than that in a case where the adjustment region 25 is defined by only the element body 21. At this time, the relationship among the thermal expansion coefficients of the resin structure 10, the adjustment region 25, and the inner electrode 23 is adjusted such that the thermal expansion coefficient of the adjustment region 25 is smaller than the thermal expansion coefficient of the inner electrode 23, and is larger than the thermal expansion coefficient of the resin structure 10. That is, by adjusting the thermal expansion coefficient such that the thermal expansion coefficient of the resin structure 10<the thermal expansion coefficient of the adjustment region 25<the thermal expansion coefficient of the inner electrode 23, the respective differences in the thermal expansion coefficients between the resin structure 10 and the adjustment region 25 and between the adjustment region 25 and the inner electrode 23 are reduced, and the first wiring layer 32a is thus reduced or prevented from being disconnected.

Note that the thermal expansion coefficient of the resin structure 10 and the thermal expansion coefficient of the adjustment region 25 may be the same or substantially the same as each other, or the thermal expansion coefficients of the adjustment region 25 and the inner electrode 23 may be the same or substantially the same as each other. That is, the thermal expansion coefficients of the resin structure 10, the adjustment region 25, and the inner electrode 23 may be adjusted so as to satisfy an expression of the thermal expansion coefficient of the resin structure 10≤the thermal expansion coefficient of the adjustment region 25≤the thermal expansion coefficient of the inner electrode 23.

The adjustment of the thermal expansion coefficient of the adjustment region 25 is able to be performed by adjusting a size, a material, an occupation ratio in the adjustment region 25, an arrangement position, and the like of the adjustment electrode 27.

An example of an actual value and an adjustment value of the thermal expansion coefficient will be described below.

For example, when Cu is used as the inner electrode 23, the thermal expansion coefficient of the inner electrode 23 is about 16.8 ppm/° C., which is a thermal expansion coefficient of Cu.

Furthermore, since the element body 21 is made of the ceramic material or the ceramic-containing material, the thermal expansion coefficient of the element body 21 is, for example, about 6 ppm/° C. to about 11 ppm/° C.

Furthermore, the thermal expansion coefficient of the inner electrode 23 is close to the coefficient of linear expansion of a conductor metal which is a material of the inner electrode 23. Note that when an additive having a different coefficient of linear expansion from that of the inner electrode 23 is partially added to the inner electrode 23, the thermal expansion coefficient of the inner electrode 23 is able to be changed. For example, when an additive having a coefficient of linear expansion smaller than the coefficient of linear expansion of the conductor metal is added to the inner electrode 23, the coefficient of linear expansion of the inner electrode 23 is able to be made smaller than the coefficient of linear expansion of the conductor metal. Additionally, when an additive having a coefficient of linear expansion larger than the coefficient of linear expansion of the conductor metal is added to the inner electrode 23, the coefficient of linear expansion of the inner electrode 23 is able to be made larger than the coefficient of linear expansion of the conductor metal.

Furthermore, although the values of coefficient of linear expansion are different between the portion of the element body 21 and the portion of the inner electrode 23, the thermal expansion coefficient of the electronic component 20 is preferably, for example, about 6 ppm/° C. to about 11 ppm/° C.

Furthermore, the thermal expansion coefficient of the resin structure 10 may be appropriately set in association with the electrode provided in the element body 21. For example, the thermal expansion coefficient of the resin structure 10 may be a value close to the thermal expansion coefficient of the inner electrode 23. When Cu is used as the inner electrode 23, the thermal expansion coefficient of the resin structure 10 may preferably be about 16.8 ppm/° C., which is the same as the thermal expansion coefficient of Cu.

Here, in a case where the thermal expansion coefficient of the resin structure 10 is about 7 ppm/° C. to about 18 ppm/° C., the thermal expansion coefficient of the element body 21 is about 6 ppm/° C. to about 11 ppm/° C., and the thermal expansion coefficient of the inner electrode 23 is about 12 ppm/° C. to about 26 ppm/° C., the thermal expansion coefficient of the adjustment region 25 is described. In this case, the adjustment electrode 27 is provided in the adjustment region 25 of the element body 21, so that the thermal expansion coefficient of the adjustment region 25 is close to the thermal expansion coefficient of the resin structure 10.

Within the thermal expansion coefficient range described above, it is preferable, for example, that the thermal expansion coefficient of the resin structure 10 is about 7 ppm/° C. to about 18 ppm/° C. and the thermal expansion coefficient of the adjustment region 25 after the adjustment is about 6 ppm/° C. to about 24 ppm/° C. Note that depending on actual configuration and structure and a degree of desired improvement effect, the thermal expansion coefficient is not limited to this range.

For example, in a case where the thermal expansion coefficients are set to about 16 ppm/° C. for the resin structure 10, to about 8 ppm/° C. for the element body 21, and to about 18 ppm/° C. for the inner electrode 23, when the adjustment region 25 is defined by the element body 21 as it is, by adjusting the occupation ratio of the adjustment electrode 27 provided in the adjustment region 25 and providing the adjustment electrode 27 such that the thermal expansion coefficient in the adjustment region 25 is about 10 ppm/° C., the problem is solved. That is, it is preferable to provide the adjustment electrode 27 such that the difference in the thermal expansion coefficient between the resin structure 10 and the adjustment region 25 after the adjustment (after the adjustment electrode 27 is provided) is about 6 ppm/° C. or less.

For example, after a heat cycle test to cool or heat at about −40° C. and about 125° C. for about 30 minutes each is performed for 100 cycles, in the case where the difference in the thermal expansion coefficient between the resin structure 10 and the adjustment region 25 after the adjustment (after the adjustment electrode 27 is provided) is within about 6 ppm/° C., no disconnection failure of the first wiring layer 32a after the 100 cycles occurs, but in a case where the difference in the thermal expansion coefficient between the resin structure 10 and the adjustment region 25 after the adjustment (after the adjustment electrode 27 is provided) is larger than about 6 ppm/° C., disconnection of the first wiring layer 32a or deterioration in a resistance value of the first wiring layer 32a occurs. Therefore, for example, it is preferable to provide the adjustment electrode 27 such that the difference in the thermal expansion coefficient between the resin structure 10 and the adjustment region 25 after the adjustment (after the adjustment electrode 27 is provided) is about 6 ppm/° C. or less.

Furthermore, in the heat cycle test, it has been discovered that it is more preferable to set the difference in the thermal expansion coefficient between the resin structure 10 and the adjustment region 25 after the adjustment (after the adjustment electrode 27 is provided) to about 3 ppm/° C., for example. Accordingly, by adjusting the occupation ratio of the adjustment electrode 27 provided in the adjustment region 25, the adjustment electrode 27 may be provided such that the thermal expansion coefficient in the adjustment region 25 is about 13 ppm/° C., for example. That is, the adjustment electrode 27 may be provided such that the difference in the thermal expansion coefficient between the resin structure 10 and the adjustment region 25 after the adjustment (after the adjustment electrode 27 is provided) is about 3 ppm/° C. or less, for example.

The adjustment of the thermal expansion coefficient of the adjustment region 25 is able to be performed by adjusting a type and a size of a material used for the adjustment electrode 27, an occupation ratio in the adjustment region 25, an arrangement position of the adjustment electrode 27, and the like.

For example, although the adjustment electrode 27 is described as being in contact with the first inner electrode 23a in the electronic component device 1 illustrated in FIG. 2B, the configuration is not limited thereto, and a configuration may be such that the adjustment electrode 27 does not make contact with the first inner electrode 23a. Furthermore, although the adjustment electrode 27 is described as being in contact with the resin structure 10 in the electronic component device 1 illustrated in FIG. 2B, the configuration is not limited thereto, and a configuration may be such that the adjustment electrode does not make contact with the resin structure 10. For example, as in an electronic component device 1a illustrated in FIG. 3A, a configuration may be such that the adjustment electrode 27 makes contact with the first inner electrode 23a and does not make contact with the resin structure 10. Furthermore, as in an electronic component device 1b illustrated in FIG. 3B, a configuration may be such that the adjustment electrode 27 makes contact with the resin structure 10 and does not make contact with the first inner electrode 23a.

Furthermore, in the electronic component device 1 illustrated in FIG. 2B, Cu is used as the material for the adjustment electrode 27, but the material of the adjustment electrode 27 is not limited thereto, and a metal material, such as, for example, Ag, Ni, W, or the like may be used. As for the material of the adjustment electrode 27, in accordance with the thermal expansion coefficients of the inner electrode 23, the resin structure 10, and the element body 21, these metal materials may be appropriately selected. Furthermore, the adjustment electrode 27 is not limited to being made of a metal material, and may be made of other materials as long as the member is made of a material having a coefficient of linear expansion larger than that of the element body 21.

Furthermore, as described above, the plurality of adjustment electrodes 27 may be provided, and the plurality of adjustment electrodes 27 may have the same or substantially the same shape. Furthermore, the plurality of adjustment electrodes 27 may be arranged along the inner electrode 23 in the depth direction of the element body 21 at a constant interval. Furthermore, the number of adjustment electrodes 27 is not limited to two or more, and may be one. Furthermore, when the plurality of adjustment electrodes 27 are provided, the shapes of the adjustment electrodes 27 may be different from one another, the adjustment electrodes 27 may be periodically arranged, or may not be periodically arranged.

As described above, with the electronic component device 1 according to the present preferred embodiment, by providing the adjustment electrode 27 in the element body 21 between the resin structure 10 and the inner electrode 23, the region between the resin structure 10 and the inner electrode 23 is provided as the adjustment region 25, and it is thus possible to reduce the differences in the thermal expansion coefficients between the resin structure 10 and the element body 21, and between the element body 21 and the inner electrode 23. With this configuration, it is possible to reduce or prevent the wiring from being cut at the boundary between the resin structure 10 and the element body 21.

Note that although the capacitor, the inductor, or the like is exemplified as a specific example of the second inner electrode 23b provided in the electronic component 20, since preferred embodiments of the present invention improve thermal shock resistance by adjusting the thermal expansion coefficients of the resin structure 10 and the inner electrode 23, the advantageous effects achieved by preferred embodiments of the present invention are able to be obtained without depending on the type of the functional element, such as the capacitor, the inductor, or the like.

Additionally, although the electronic component device 1 in the above-described preferred embodiment is able to be mounted on a printed wiring substrate or the like and to function alone, a mounted component or the like connected thereto with the inner electrode 23 and the first wiring layer 32a or the second wiring layer 32b interposed therebetween may be provided. Furthermore, the device is able to also be used as a package which is an electronic component device having a higher density by sealing the mounted component with resin or the like into the electronic component device.

Second Preferred Embodiment

Figure 4:
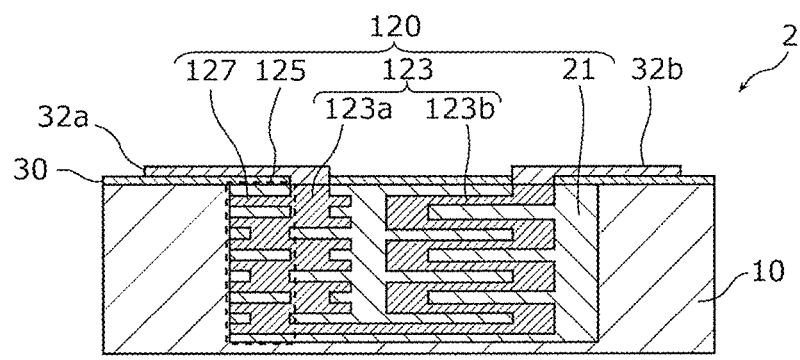
FIG. 4 is a transparent cross-sectional view illustrating an internal configuration of an electronic component device according to a second preferred embodiment of the present invention.

A second preferred embodiment of the present invention will be described with reference to FIG. 4. FIG. 4 is a cross-sectional view illustrating an internal configuration of an electronic component device 2 according to the present preferred embodiment.

The electronic component device 2 according to the present preferred embodiment differs from the electronic component device 1 described in the first preferred embodiment in that an inner electrode 123 and an adjustment electrode 127 have different shapes from the inner electrode 23 and the adjustment electrode 27 according to the first preferred embodiment. The remaining portions are the same or substantially the same as those of the electronic component device 1 described in the first preferred embodiment, and thus detailed description thereof will be omitted.

As illustrated in FIG. 4, in the electronic component device 2, the inner electrode 123 is configured of a plurality of first inner electrodes 123a and a second inner electrode 123b. A configuration of the second inner electrode 123b is the same as that of the second inner electrode 23b described in the first preferred embodiment, and thus description thereof will be omitted.

Each of the plurality of first inner electrodes 123a is a pillar-shaped inner electrode having a predetermined height in the depth direction of the element body 21. The predetermined height is, for example, as illustrated in FIG. 4, a size obtained by dividing the thickness of the element body 21 in an electronic component 120 into five equal portions. The plurality of first inner electrodes 123a is alternately arranged in a region below an end portion of the first wiring layer 32a on a side connected to the electronic component 120 and an adjustment region 125.

Additionally, the adjustment electrodes 127 are connected to upper and lower portions of each of the plurality of first inner electrodes 123a, respectively. Furthermore, by connecting the adjustment electrodes 127 connected to the adjacent different first inner electrodes 123a to each other, the plurality of first inner electrodes 123a are connected to one another with the adjustment electrodes 127 interposed therebetween.

For example, in FIG. 4, three first inner electrodes 123a are provided in the region below the end portion of the first wiring layer 32a on the side connected to the electronic component 120. Furthermore, the adjustment electrodes 127 are connected to upper and lower surfaces of each of the first inner electrodes 123a. Similarly, three first inner electrodes 123a are provided in the adjustment region 125. The adjustment electrodes 127 are connected to upper and lower surfaces of each of the first inner electrodes 123a. Furthermore, the adjustment electrodes 127 in the region below the end portion of the first wiring layer 32a on the side connected to the electronic component 120 and the adjustment electrodes 127 in the adjustment region 125 are disposed in the respective regions so as to be connected at heights where the first inner electrodes 123a are alternately arranged in the thickness direction of the element body 21.

In this manner, since the number of first inner electrodes 123a and adjustment electrodes 127 in the region below the end portion of the first wiring layer 32a on the side connected to the electronic component 120 and the number thereof in the adjustment region 125 are the same or similar, it is possible to further reduce the difference between the thermal expansion coefficient in the region below the end portion of the first wiring layer 32a on the side connected to the electronic component 120 and the thermal expansion coefficient in the adjustment region 125. Therefore, it is possible to reduce or prevent the first wiring layer 32a from being disconnected at the boundary between the inner electrode and the adjustment region 125.

Note that in the electronic component device 2 according to the present preferred embodiment, the height of the first inner electrode 123a is described as the size obtained by dividing the thickness of the element body 21 in the electronic component 120 into five equal portions, but the height of the first inner electrode 123a is not limited thereto, and a configuration may be such that the plurality of first inner electrodes 123a is arranged in the thickness direction of the element body 21 in the electronic component 120.

Third Preferred Embodiment

Figure 5:
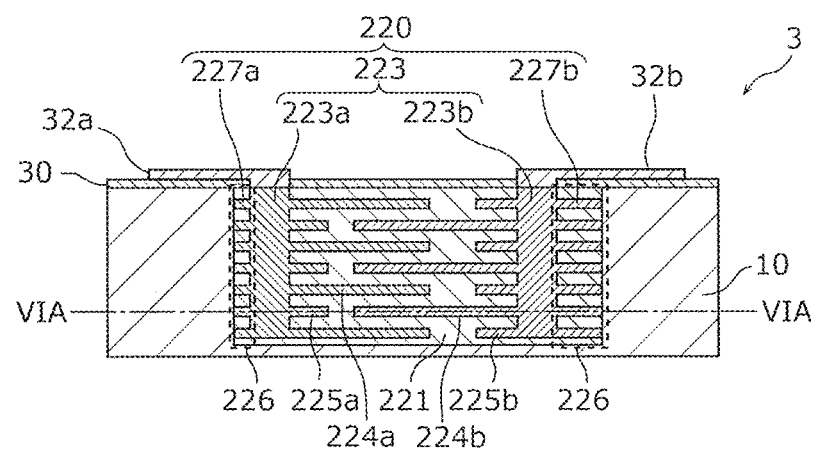
FIG. 5 is a transparent cross-sectional view illustrating an internal configuration of an electronic component device according to a third preferred embodiment of the present invention.
Figure 6A:
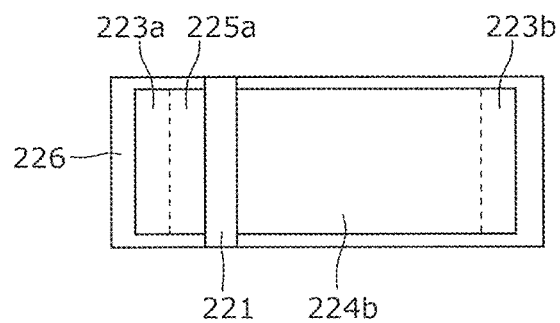
FIG. 6A is a transparent plan view illustrating an example of the internal configuration of the electronic component device according to the third preferred embodiment of the present invention.
Figure 6B:
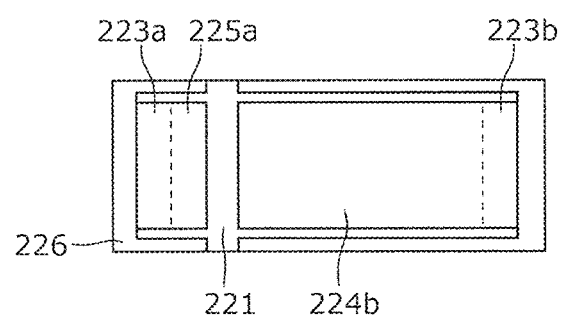
FIG. 6B is a transparent plan view illustrating another example of the internal configuration of the electronic component device according to the third preferred embodiment of the present invention.

A third preferred embodiment of the present invention will be described with reference to FIG. 5 to FIG. 6B. FIG. 5 is a cross-sectional view illustrating an internal configuration of an electronic component device according to the present preferred embodiment. FIG. 6A is a transparent plan view illustrating an example of the internal configuration of the electronic component device according to the present preferred embodiment. FIG. 6B is a transparent plan view illustrating another example of the internal configuration of the electronic component device according to the present preferred embodiment. Note that in FIGS. 6A and 6B, the resin structure 10 is not illustrated, and only a portion of the electronic component is illustrated. The resin structure 10 is disposed around the structure illustrated in FIGS. 6A and 6B.

An electronic component device 3 according to the present preferred embodiment is different from the electronic component device 1 described in the first preferred embodiment in that an electronic component 220 defines a capacitor.

As illustrated in FIG. 5, the electronic component 220 includes an inner electrode 223 in an element body 221. The inner electrode 223 includes a first inner electrode 223a and a second inner electrode 223b. Configurations of the first inner electrode 223a and the second inner electrode 223b are the same or substantially the same as that of the first inner electrode 23a described in the first preferred embodiment, and thus detailed description thereof will be omitted.

The first inner electrode 223a includes an adjustment electrode 227a in an adjustment region 226. Configurations of the adjustment region 226 and the adjustment electrode 227a are the same or substantially the same as those of the adjustment region 25 and the adjustment electrode 27 described in the first preferred embodiment, respectively, and thus detailed description thereof will be omitted.

Additionally, the first inner electrode 223a includes electrodes 224a and 225a connected to the first inner electrode 223a in a region on an opposite side from the adjustment region 226 with the first inner electrode 223a sandwiched therebetween. The electrodes 224a and 225a are alternately arranged along the first inner electrode 223a in a depth direction of the element body 221. The electrode 224a preferably has a longer length than the electrode 225a.

In the same or similar manner, the second inner electrode 223b includes electrodes 224b and 225b connected to the second inner electrode 223b in a region on an opposite side from the adjustment region 226 with the second inner electrode 223b sandwiched therebetween. The electrodes 224b and 225b are alternately arranged along the second inner electrode 223b in the depth direction of the element body 221. The electrode 224b preferably has a longer length than the electrode 225b.

Here, FIG. 6A illustrates a cross-sectional view of the electronic component 220 taken along a VIA-VIA line illustrated in FIG. 5. As illustrated in FIG. 6A, in the element body 221, the electrode 225a and the electrode 224b are provided in the same layer with a gap therebetween. The element body 221 is exposed between the electrode 225a and the electrode 224b. In the same or similar manner, the electrode 224a and the electrode 225b are provided in the same layer with a gap therebetween. The element body 21 is exposed between the electrode 224a and the electrode 225b. Additionally, the electrode 224a and the electrode 224b are arranged such that the electrode 224a and the electrode 224b partially overlap with each other when viewed in a plan view. As a result, the electrode 224a and the electrode 224b define and function as a capacitor. In addition, the capacitor defined by the electrode 224a and the electrode 225b is connected to the first inner electrode 223a and the second inner electrode 223b. Note that the electrode 224a and the electrode 224b correspond to a first planar electrode and a second planar electrode.

Furthermore, the first inner electrode 223a and the second inner electrode 223b are connected to the first wiring layer 32a and the second wiring layer 32b, respectively. The first wiring layer 32a and the second wiring layer 32b are the same or substantially the same as the first wiring layer 32a and the second wiring layer 32b described in the first preferred embodiment, and thus description thereof will be omitted.

With such a configuration, in the electronic component 220 including the capacitor, by providing the adjustment electrode 227a in the element body 221 in the adjustment region 226 between the resin structure 10 and the first inner electrode 223a, it is possible to reduce the difference in the thermal expansion coefficient between the resin structure 10 and the element body 221, and the difference in the thermal expansion coefficient between the element body 221 and the first inner electrode 223a. Accordingly, it is possible to reduce or prevent the first wiring layer 32a from being cut at the boundary between the resin structure 10 and the element body 221.

Note that between the resin structure 10 and the second inner electrode 223b1, in the same or similar manner, by providing the adjustment electrode 227b in the element body 221, it is possible to reduce the difference in the thermal expansion coefficient between the resin structure 10 and the element body 221, and the difference in the thermal expansion coefficient between the element body 221 and the second inner electrode 223b. With this configuration, it is possible to reduce or prevent the second wiring layer 32b from being cut at the boundary between the resin structure 10 and the element body 221.

Furthermore, in the element body 221, the electrode 225a and the electrode 224b may be configured such that, as illustrated in FIG. 6B, the element body 221 is exposed to a portion other than the portion between the electrode 225a and the electrode 224b. In the same or similar manner, the electrode 224a and the electrode 225b may be configured such that the element body 221 is exposed to a portion other than the portion between the electrode 224a and the electrode 225b.

Fourth Preferred Embodiment

Figure 7A:
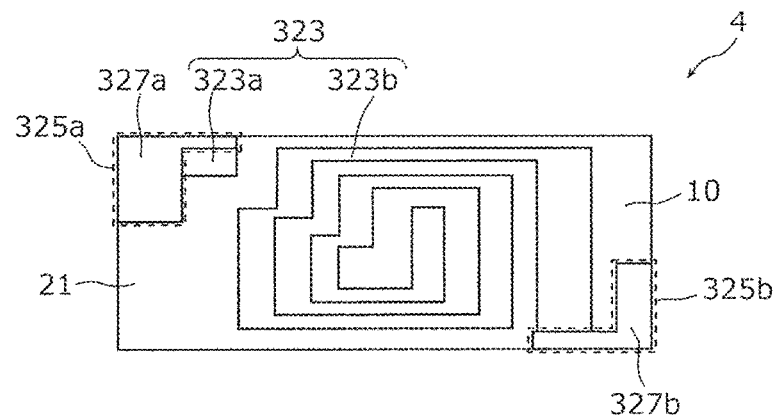
FIG. 7A is a transparent plan view illustrating an internal configuration of an electronic component device according to a fourth preferred embodiment of the present invention.
Figure 7B:
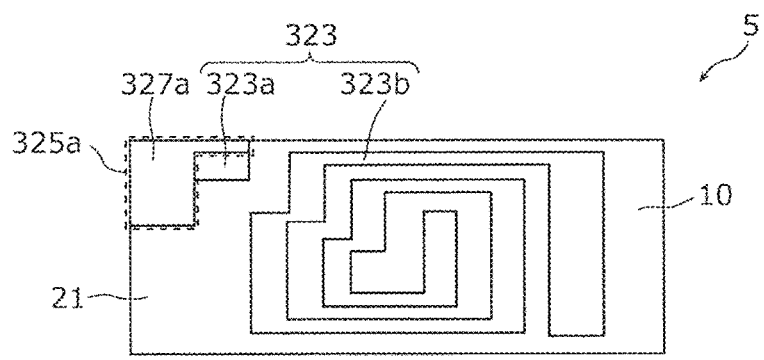
FIG. 7B is a transparent plan view illustrating the internal configuration of the electronic component device according to the fourth preferred embodiment of the present invention.

Next, a fourth preferred embodiment of the present invention will be described with reference to FIGS. 7A and 7B. FIGS. 7A and 7B are transparent plan views illustrating examples of internal configurations of electronic component devices 4 and according to the present preferred embodiment, respectively. Note that in FIGS. 7A and 7B, the resin structure 10 and the first wiring layer 32a and the second wiring layer 32b are not illustrated, and only a portion of the electronic component is illustrated. The resin structure 10 is provided around the structure illustrated in FIG. 7A. The first wiring layer 32a is connected to an inner electrode 323 of the electronic component 20, and is continuously provided on the inner electrode 323, an adjustment region 325a, and the resin structure 10. The second wiring layer 32b is connected to the inner electrode 323 of the electronic component 20, and is continuously provided on the inner electrode 323, an adjustment region 325b, and the resin structure 10.

The electronic component device 4 according to the present preferred embodiment differs from the electronic component device 1 described in the first preferred embodiment in that a position at which the adjustment electrode is provided is different from that of the electronic component device 1 described in the first preferred embodiment.

As illustrated in FIG. 7A, the element body 21 of the electronic component device 4 includes the inner electrode 323. The inner electrode 323 includes a first inner electrode 323a and a second inner electrode 323b. A configuration of the second inner electrode 323b is the same or substantially the same as that of the second inner electrode 23b described in the first preferred embodiment, and thus description thereof will be omitted.

The element body 21 preferably has a rectangular or substantially rectangular shape when the electronic component device 4 is viewed in a plan view from a side of one main surface of the element body 21, that is, a surface on which the first wiring layer 32a (see FIGS. 2A and 2B) is provided. Adjustment electrodes 327a and 327b are each provided on a corner portion of the element body 21 having the rectangular or substantially rectangular shape along a portion of each of the two sides defining at least one corner portion of the element body 21. That is, each of the adjustment electrodes 327a and 327b preferably has an L-shape at least one corner portion of the rectangular or substantially rectangular shape of the element body 21.

Additionally, as illustrated in FIG. 7A, the adjustment electrodes 327a and 327b are provided at a pair of corner portions which face each other in the element body 21, respectively. The adjustment electrode 327a is connected to the first inner electrode 323a.

According to this configuration, since contact areas between each of the adjustment electrodes 327a and 327b and the resin structure 10, and between each of the adjustment electrodes 327a and 327b and the element body 21 are able to be increased, the thermal expansion coefficient in the adjustment region 325a is able to be brought close to the thermal expansion coefficients of the resin structure 10 and the inner electrode 323 more quickly. With this configuration, it is possible to reduce or prevent the first wiring layer 32a and the second wiring layer 32b from being cut at the boundaries between the resin structure 10 and the element body 21 and between the element body 21 and the inner electrode 323.

The adjustment electrodes 327a and 327b are described as being provided at the pair of corner portions facing each other in the element body 21 when the electronic component device 4 is viewed in a plan view from the side of the surface on which the first wiring layer 32a is provided, but are not limited thereto, and may be provided at corner portions which do not face each other, that is, adjacent corner portions in the element body 21.

Additionally, as in the electronic component device 5 illustrated in FIG. 7B, in the element body 21, only one corner portion may be provided with the adjustment region 325a and the adjustment electrode 327a.

Fifth Preferred Embodiment

Next, a fifth preferred embodiment of the present invention will be described with reference to FIG. 8.

The electronic component devices described in the first to fourth preferred embodiments described above may each be applied to a high-frequency front end circuit, a communication device including the high-frequency front end circuit, and the like. Therefore, in the present preferred embodiment, a configuration of the high-frequency front end circuit and the communication device according to the present preferred embodiment including the electronic component device according to each of the above-described first to fourth preferred embodiments will be described.

Figure 8:
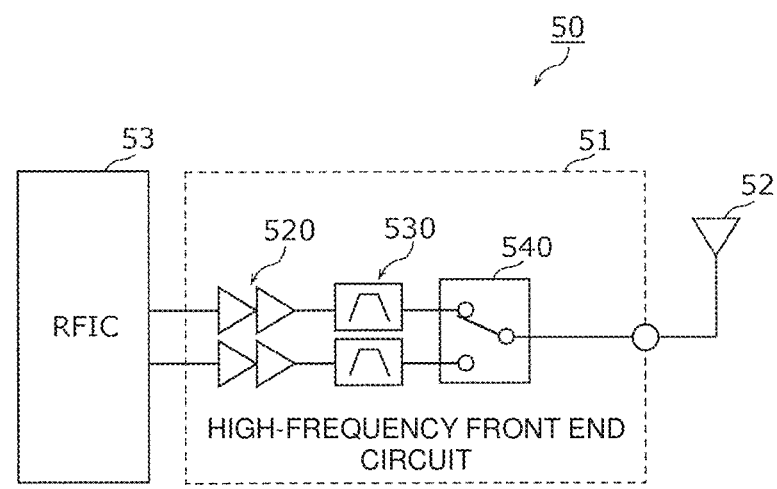
FIG. 8 is a configuration diagram of a communication device and a high-frequency front end circuit according to a fifth preferred embodiment of the present invention.

FIG. 8 is a configuration diagram of a high-frequency front end circuit 51 and a peripheral circuit thereof according to the present preferred embodiment. FIG. 8 illustrates an antenna element 52 and an RFIC 53 which define a communication device 50 together with the high-frequency front end circuit 51. The antenna element 52 is included in the communication device 50 in the present preferred embodiment, but may not be incorporated therein.

The antenna element 52 is preferably a multi-band capable antenna for transmission and reception of a high-frequency signal, for example.

The RFIC 53 is an RF signal processing circuit that processes the high-frequency signal transmitted and received through the antenna element 52. Specifically, the RFIC 53 performs signal processing on a transmission signal input from a baseband signal processing circuit (not illustrated) by up conversion or the like, and outputs a high-frequency signal (here, a high-frequency transmission signal) generated by the signal processing to a transmission-side signal path of the high-frequency front end circuit 51. Additionally, the RFIC 53 performs signal processing on a high-frequency signal (here, a high-frequency reception signal) input from the antenna element 52 through a reception-side signal path (not illustrated) of the high-frequency front end circuit 51 by down conversion or the like, and outputs a reception signal generated by the signal processing to the baseband signal processing circuit.

The high-frequency front end circuit 51 transmits a high-frequency signal between the antenna element 52 and the RFIC 53. Specifically, the high-frequency front end circuit 51 transmits a high-frequency signal (here, a high-frequency transmission signal) output from the RFIC 53 to the antenna element 52 through the transmission-side signal path. Note that the high-frequency front end circuit 51 may transmit a high-frequency signal (here, a high-frequency reception signal) received by the antenna element 52 to the RFIC 53 through the reception-side signal path (not illustrated).

In the present preferred embodiment, the high-frequency front end circuit 51 includes an amplifier circuit group 520, a filter group 530, and a switch circuit 540.

The amplifier circuit group 520 includes amplifier circuits individually corresponding to a plurality of bands. Specifically, the amplifier circuit includes one or more power amplifiers to perform power amplification on the high-frequency transmission signal output from the RFIC 53, and in the present preferred embodiment, preferably includes stages of power amplifiers connected in multistage (cascading connection).

The filter group 530 includes filters individually corresponding to the plurality of bands, and filters the high-frequency signal amplified by the amplifier circuit group 520 with the frequency band of the corresponding band. In the present preferred embodiment, the filter group 530 includes a filter having a low-band frequency band (a low-band cellular band) as a pass band and a filter having a high-band frequency band (a high-band cellular band) as a pass band.

The switch circuit 540 includes a common terminal connected to the antenna element 52, and a plurality of selection terminals (two selection terminals in the present preferred embodiment) selectively connected to the terminal. Here, the plurality of selection terminals are connected to a plurality of filters of the filter group 530, respectively. The switch circuit 540 connects any of the plurality of selection terminals and the common terminal to each other in accordance with a control signal from a control unit, such as the RFIC 53 or the like. Note that the number of the selection terminals connected to the common terminal is not limited to one, and may be more than one.

In the present preferred embodiment, at least any of the amplifier circuit group 520, the filter group 530, and the switch circuit 540 is provided with the electronic component device described in the first to fourth preferred embodiments.

The communication device 50 and the high-frequency front end circuit 51 configured as described above amplify the high-frequency signal (here, the high-frequency transmission signal) output from the RFIC 53 and transmit the resulting signal to the antenna element 52 through the transmission-side signal path. Note that the high-frequency front end circuit 51 may transmit the high-frequency signal (here, the high-frequency reception signal) received by the antenna element 52 to the RFIC 53 through the reception-side signal path (not illustrated).

By using the electronic component device described in the first to fourth preferred embodiments described above, the electronic component device is able to reduce the difference in the thermal expansion coefficient between the resin structure and the element body, and the difference in the thermal expansion coefficient between the element body and the inner electrode. This makes it possible to reduce or prevent the first wiring layer from being cut at the boundary between the resin structure and the element body. Accordingly, in the electronic component device, the high-frequency front end circuit, and the communication device, the disconnection or the like of the wiring caused by the difference between the thermal expansion coefficients is able to be reduced or prevented.

The communication device 50 and the high-frequency front end circuit 51 may be configured to include only one reception filter or only one transmission filter, or may be configured to include a plurality of reception filters or a plurality of transmission filters. Furthermore, the communication device 50 and the high-frequency front end circuit 51 may have a configuration for transmission and reception including at least one transmission filter and at least one reception filter.

Although the electronic component devices according to the preferred embodiments of the present invention have been described using the preferred embodiments, the electronic component device according to the present invention is not limited to the above-described preferred embodiments. The present invention also encompasses other preferred embodiments that are obtained by combining desired elements in the above-described preferred embodiments, modifications obtained by adding various changes to the above-described preferred embodiments, which are conceived by those skilled in the art, without departing from the gist of the present invention, and communication devices and various apparatuses incorporating the above-described electronic component devices.

Figure 9A:
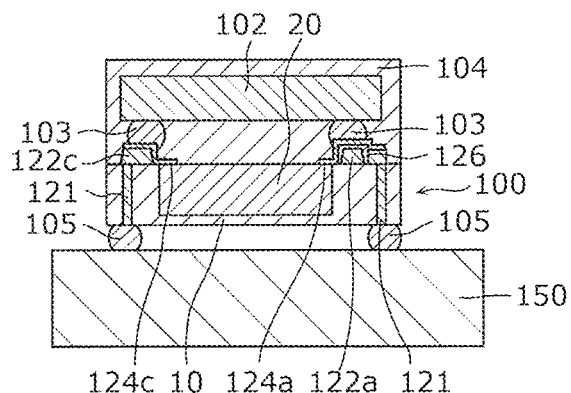
FIG. 9A is a cross-sectional view illustrating another configuration of the electronic component device.

For example, as illustrated in FIG. 9A, the electronic component device may be a device in which a mounted component 102 is mounted on a solder mounting pad provided on the first wiring layer 32a and the second wiring layer 32b. The mounted component 102 is preferably, for example, a high-frequency circuit component, such as a filter or the like, or an electronic component, such as an inductor, a capacitor, or the like. More specifically, an electronic component, such as an acoustic wave filter, a piezoelectric resonator, a multilayer capacitor, or the like, for example, may be used as the high-frequency circuit component. Additionally, as the mounted component 102, a module component may be used. Additionally, the mounted component 102 may be a mounting substrate.

Furthermore, the electronic component device 1 on which the mounted component 102 is mounted may further include a sealing layer 104 to seal the mounted component 102 on an electronic component device 100. As a material for the sealing layer 104, a resin such as polyimide, benzocyclobutene, polybenzoxazole, a phenol-based resin, a silicone-based resin, or the like, for example, may preferably be used.

Furthermore, as illustrated in FIG. 9A, the electronic component device may be mounted on a module substrate 150 which is a mounting substrate with solder balls 105 interposed therebetween.

Figure 9B:
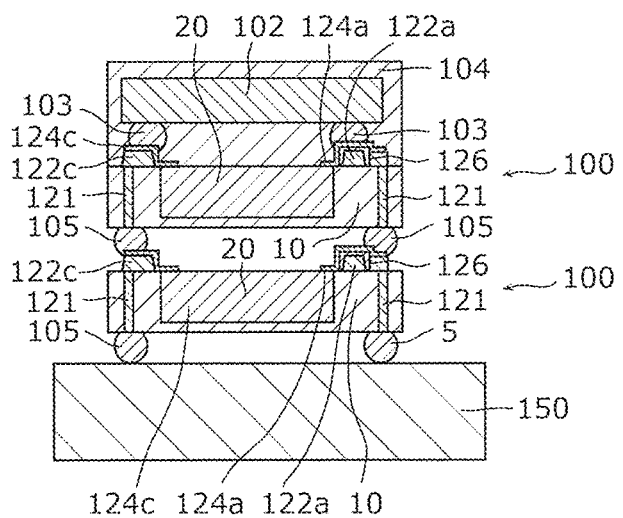
FIG. 9B is a cross-sectional view illustrating another configuration of the electronic component device.

Furthermore, the electronic component device may have a configuration in which a plurality of electronic component devices 100 are stacked between the mounted component 102 and the module substrate 150 illustrated in FIG. 9A. For example, as illustrated in FIG. 9B, two electronic component devices 100 are stacked between the mounted component 102 and the module substrate 150. The mounted component 102, the two electronic component devices 100, and the module substrate 150 may be electrically connected with the solder balls 105 and through-electrodes 121 penetrating through both surfaces of the substrate 10 of the electronic component device 100 interposed therebetween.

Furthermore, in the electronic component devices according to the above preferred embodiments, the electronic component may preferably include a capacitor, or may include an inductor, for example. Additionally, other multilayer electronic components may be included.

Furthermore, the element body in the electronic component may be made of a ceramic material, a ceramic-containing material, or the like. The element body may be made of, for example, a mixture of alumina, ceramic powder, glass, a resin, or the like, or may be made of other materials. The inner electrode may be made of, for example, a single metal or an alloy containing a good conductor such as Cu, Ag, W, Au, Ni, or the like as its main component, or a mixture or the like of the above-described main component and glass, a resin, ceramics, or the like. The electronic component and the inner electrode may be made of the same material, or may be made of different materials.

Furthermore, the adjustment electrode may be connected to the inner electrode, or may not be connected thereto. Furthermore, the adjustment electrode may be in contact with the resin structure, or may not be in contact therewith.

Furthermore, as a material for the adjustment electrode, for example, a metal material such as Cu, Ag, Ni, W, or the like may be used, or other materials may be used. In accordance with the thermal expansion coefficients of the inner electrode, the resin structure, and the element body, these metal materials may be appropriately selected as the material of the adjustment electrode. Furthermore, the electrode is not limited to being made of the metal material, may be made in any way as long as the member is made of a material having a coefficient of linear expansion larger than that of the element body.

Furthermore, the plurality of adjustment electrodes may be provided, and the plurality of adjustment electrodes 27 may have the same or substantially the same shape. Furthermore, the plurality of adjustment electrodes may be provided along the inner electrode in the depth direction of the element body at a constant interval. Furthermore, the number of adjustment electrodes is not limited to more than one, and may be one. Furthermore, when the plurality of adjustment electrodes are provided, the shapes of the adjustment electrodes may be different from one another, the adjustment electrodes may be periodically arranged, or may not be periodically arranged.

Furthermore, the electronic component devices described above may be used for a communication device including a duplexer, a high-frequency front end circuit, a filter, and the like.

Preferred embodiments of the present invention may be used for a communication module including a switch, a duplexer, a filter, and the like in which an electronic component is incorporated, for example, an RF module or the like used for a cellular phone or the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component device comprising:
   an electronic component;
   a resin structure inside of which the electronic component is disposed such that one main surface of the electronic component is exposed therefrom; and
   a wiring layer provided on at least a portion of a surface of each of the resin structure and the electronic component; wherein
   the electronic component includes:
     an element body;
     an inner electrode provided in the element body and connected to the wiring layer; and
     an adjustment electrode provided at least in an adjustment region between the inner electrode and a side surface of the resin structure closest to the inner electrode in the element body;
   the wiring layer is continuously provided on the inner electrode, the adjustment region, and the resin structure; and
   a thermal expansion coefficient of the resin structure, a thermal expansion coefficient of the adjustment region, and a thermal expansion coefficient of the inner electrode satisfy an expression of the thermal expansion coefficient of the resin structure≤the thermal expansion coefficient of the adjustment region≤the thermal expansion coefficient of the inner electrode.

2. The electronic component device according to claim 1, wherein the thermal expansion coefficient of the adjustment electrode is larger than the thermal expansion coefficient of the element body.

3. The electronic component device according to claim 1, wherein the adjustment electrode is in contact with the resin structure.

4. The electronic component device according to claim 1, wherein the adjustment electrode is in contact with the inner electrode.

5. The electronic component device according to claim 1, wherein a plurality of the adjustment electrodes are provided along the inner electrode in a depth direction of the element body.

6. The electronic component device according to claim 5, wherein the plurality of adjustment electrodes have a same or substantially a same thickness in the depth direction of the element body.

7. The electronic component device according to claim 5, wherein the plurality of adjustment electrodes is arranged periodically along the inner electrode in the depth direction of the element body.

8. The electronic component device according to claim 1, wherein the adjustment electrode is made of a metal.

9. The electronic component device according to claim 1, wherein the adjustment electrode is made of a same material as a material of the inner electrode.

10. The electronic component device according to claim 4, wherein the adjustment electrode protrudes from the inner electrode.

11. The electronic component device according to claim 1, wherein
   the inner electrode includes a first inner electrode and a second inner electrode connected to the first inner electrode; and
   at least one of the first inner electrode and the second inner electrode is an inductor.

12. The electronic component device according to claim 1, wherein
   the inner electrode includes a first inner electrode and a second inner electrode;
   the wiring layer includes a first wiring layer and a second wiring layer;
   the first inner electrode is connected to the first wiring layer and is in contact with the adjustment region;
   the second inner electrode is connected to the second wiring layer and is in contact with the adjustment region; and
   the electronic component is a capacitor defined by a first planar electrode connected to the first inner electrode and a second planar electrode connected to the second inner electrode.

13. The electronic component device according to claim 1, wherein
   the element body has a rectangular or substantially rectangular shape when viewed in a plan view from a side of a surface at which the wiring layer is provided; and
   the adjustment electrode is provided along a portion of each of two sides defining at least one corner portion of the rectangular or substantially rectangular shape of the element body.

14. An electronic component device comprising:
   a mounting substrate;
   the electronic component device according to claim 1, mounted on the mounting substrate; and
   a mounted component mounted on the electronic component device.

15. The electronic component device according to claim 14, wherein
   the resin structure includes a through-electrode penetrating through both surfaces of the resin structure; and
   the through-electrode is connected to the mounting substrate and the wiring layer.

16. The electronic component device according to claim 14, wherein a plurality of the electronic component devices are included, and the plurality of electronic component devices are stacked between the mounting substrate and the mounted component.

17. A high-frequency front end circuit comprising:
   the electronic component device according to claim 1 defining a high-frequency element.

18. The high-frequency front end circuit according to claim 17, wherein the thermal expansion coefficient of the adjustment electrode is larger than the thermal expansion coefficient of the element body.

19. The high-frequency front end circuit according to claim 17, wherein the adjustment electrode is in contact with the resin structure.

20. A communication device comprising:
an RF signal processing circuit to process a high-frequency signal transmitted and received through an antenna element; and
the frequency front end circuit according to claim 17 to transmit the high-frequency signal between the antenna element and the RF signal processing circuit.

* * * * *